United States Patent
Lin et al.

(10) Patent No.: US 6,709,741 B1
(45) Date of Patent: Mar. 23, 2004

(54) FPC ADHESIVE OF EPOXY RESIN, ONIUM HEXAFLUOROANTIMONATE, NITRILE RUBBER AND FILLER

(75) Inventors: Fu-Le Lin, Taipei (TW); Ching-Ping Chen, Kaohsiung (TW); Tzu-Ching Hung, Changhua (TW); Sung-Chen Huang, Chutung (TW); Kuo-Hua Yu, Yilane (TW); Kuo-Hsiung Hsia, Taichung (TW); Yen-Chi Liu, Nan-Tzu (TW)

(73) Assignee: Taiflex Scientific Co., Ltd., Taiwan (CN)

( * ) Notice: Subject to any disclaimer, the term of this patent is extended or adjusted under 35 U.S.C. 154(b) by 166 days.

(21) Appl. No.: 09/949,217

(22) Filed: Sep. 7, 2001

(51) Int. Cl.[7] .......................... B32B 25/16; B32B 27/04; B32B 27/38; C08K 3/22; C08L 63/00
(52) U.S. Cl. ............................. 428/355 EP; 428/414; 428/901; 523/457; 525/119
(58) Field of Search ........................... 525/119; 428/347, 428/355 EP, 414, 901

(56) References Cited

U.S. PATENT DOCUMENTS

| | | | | |
|---|---|---|---|---|
| 4,465,542 A | * | 8/1984 | Furihata et al. | 156/330 |
| 5,070,161 A | * | 12/1991 | Nakano et al. | 526/193 |
| 5,162,140 A | | 11/1992 | Taniguchi | |
| 5,247,113 A | * | 9/1993 | Roth et al. | 556/64 |
| 5,260,130 A | | 11/1993 | Sakaguchi et al. | |
| 5,610,443 A | * | 3/1997 | Inagaki et al. | 257/788 |
| 5,639,903 A | * | 6/1997 | Takahashi et al. | 560/15 |
| 5,747,599 A | * | 5/1998 | Ohnishi | 525/327.5 |

FOREIGN PATENT DOCUMENTS

| | | | |
|---|---|---|---|
| CN | 84105059 | | 5/1984 |
| JP | 63-186787 A | * | 8/1988 |
| JP | 5-132462 A | * | 5/1993 |
| JP | 6-157624 A | * | 6/1994 |

\* cited by examiner

*Primary Examiner*—Robert Sellers
(74) *Attorney, Agent, or Firm*—Dellett & Walters

(57) ABSTRACT

The present invention discloses an adhesive composition for flexible printed circuit board comprising the following component: (a) an epoxy resin; (b) an accelerator having a structure of one of the following general formulas:

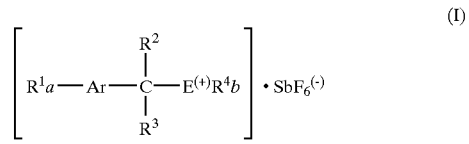

(I)

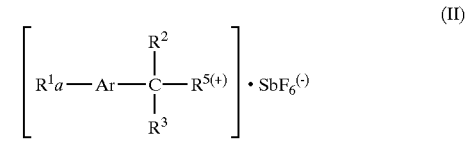

(II)

wherein, E represents sulfur, nitrogen or phosphorus; Ar represents an aromatic ring; $R^1$ is the same or different and represents a substituted or unsubatituted monovalent hydrocarbon group, a hydroxyl group, an alkoxy group, a nitro group, a cyano group or a halogen atom; $R^2$ and $R^3$ each represents a hydrogen atom and a methyl group; $R^4$ is the same or different and represents a substituted or unsubstituted monovalent hydrocarbon group; $R^5$ represents a substituted or unsubstituted pyridinium group; a represents an integer of 0 to 2; and b represents 2 to 3; (c) a nitrile rubber having carboxyl groups, and a carboxyl terminated butadiene acrylonitrile is preferred; and (d) an inorganic filler, an aluminum hydroxide is preferred.

7 Claims, No Drawings

FPC ADHESIVE OF EPOXY RESIN, ONIUM HEXAFLUOROANTIMONATE, NITRILE RUBBER AND FILLER

BACKGROUND OF THE INVENTION

1. Field of the Invention

The present invention relates to an adhesive composition for use in flexible printed circuit boards, and more particularly, to an adhesive composition with higher glass transition temperature (Tg) and longer storage period, comprising an epoxy resin, an accelerator, a nitrile rubber having carboxyl groups, and an inorganic filler, to improve the application and operation processing of flexible printed circuit boards.

2. Description of Related Art

The flexible printed circuit board (FPC board), also called the deflectable print circuit board, can be assembled in three diminsions according to the space of the final product because of its flexibility. Nowadays, the trend of the high technology instrument such as a camera, a video camera, a hi-fi equipment, a disc player, a printer and a cellular phone, is towards light, thin, short and small. Thus, the flexible printed circuit board becomes one of the important components of the high technology instrument.

The structure of the flexible printed circuit board can be divided into five basic parts, which are a prepreg, a copper foil, a substrate, a surface treatment and a reinforcement The first three parts are the major components of the flexible printed circuit board and are combined together by an adhesive. Therefore, the quality of the flexible printed circuit board is depends on the heat resistance and the storage period of the adhesive. The effectiveness and stability of the adhesive is influenced by heat, ambient temperature and moisture content produced by the operation of the flexible priented board. Therefore, the trend of the adhesive is towards higher glass transition temperature and longer storage period at room temperature.

R.O.C Patent Publication No. 279255 (Application No. 84105059) discloses an epoxy resin composition applied for packing a semiconductor device. However, the above patent is applied for packing the semiconductor device but not for improving the flexible printed circuit board. Moreover, the above epoxy resin composition has to contain an internal releasing agent such as silicone oil, fluoride type surfactant, waxes, fluid paraffin and metallic salt of stearic acid for facilitating the mold release.

U.S. Pat. No. 5,162,140 discloses a flexible printed circuit board and an adhesive thereinto. However, the accelerator contained in the above adhesive is a salt of Lewis acid rather than an onium salt of hexafluoroantimonic acid. U.S. Pat. No. 5,260,130 also discloses an adhesive for a flexible printed circuit board, which must contain a curing agent and an accelerator. The accelerator is a borofluoride of zinc, tin or nickel rather than an onium salt of hexafluoroantimonic acid.

The above patents are not applied to improve the glass transition temperature or the storage period of the adhesive of the flexible printed circuit board.

BRIEF SUMMARY OF THE INVENTION

The present invention discloses an adhesive composition in accordance with the need of the market of the flexible printed circuit board, comprising an epoxy resin, an accelerator, a nitnl rubber having carboxy groups and an inorganic filler. The present invention provides an adhesive composition with higher glass transition temperature (140° C. to 170° C.) and longer storage period at room temperature (more than 50 days) by using an onium salt of hexafluoroantimonic acid as its accelerator. Therefore, the poor application of the printed circuit board because of the unstability of the adhesive is avoided.

A major object of the present invention is to provide an adhesive composition applied to a flexible printed circuit board and having high transition temperature (Tg) and long storage period, comprising an epoxy resin, an accelerator such as an onium salt of hexafluoroantimonic acid, a nitrile rubber having carboxyl groups and an inorganic filler.

PREFERRED EMBODIMENT OF THE PRESENT INVENTION

The present invention provides an adhesive composition applied for a flexible printed circuit board and having properties of heat-resistant, high transition temperature, long storage period at room temperature and rapid curing reaction, comprising:

(a) an epoxy resin;
(b) an accelerator having a structure of one of the following general formulas:

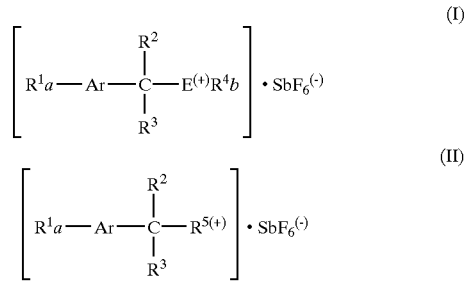

wherein, E represents sulfur, nitrogen or phosphorus; Ar represent an aromatic ring; $R^1$ is the same or different and represents a substituted or unsubatituted monovalent hydrocarbon group, a hydroxyl group, an alkoxy group, a nitro group, a cyano group or a halogen atom; $R^2$ and $R^3$ each represents a hydrogen atom and a methyl group; $R^4$ is the same or different and represents a substituted or unsubstituted monovalent hydrocarbon group; $R^5$ represents a substituted or unsubstituted pyridinium group; a represents an integer of 0 to 2; and b represents 2 to 3;

(c) a nitrile rubber having carboxyl groups, and a carboxyl terminated butadiene acrylonitrile is preferred; and
(d) an inorganic filler, and an aluminum hydroxide is preferred.

wherein the weight ratio of the accelerator to the epoxy resin is between 0.5:1 to 0.1:1 0.008:1 to 0.03:1, the weight ratio of the nitrile rubber to the epoxy resin is between 1:5 to 10:1 and the weight ratio of the inorganic filler to the epoxy resin is between 1:2 to 2:1.

The molecular structure of the epoxy resin in the component (a) is unlimited only if that the structure contains two or more epoxy groups in every monomer. The epoxy resin of the present invention can be used either individually or as a combination of the two or more kinds of epoxy resin. Moreover, the component (a) of the present invention is (1) a curable epoxy resin which is liquid at ordinary temperature; or (2) a curable liquid mixture of liquid curable epoxy resin and solid curable epoxy resin at ordinary temperature and the latter (i.e. solid curable epoxy resin) can exhibit a liquid state at ordinary temperature by diluting it with a diluents. Herein, "liquid at ordinary temperature" means that the above epoxy resin has fluidity between 25° C. and 40° C. and a so-called semisolid state is included.

The curable epoxy resin (1) is liquid at ordinary temperature comprising: a bisphenol A type epoxy resin having an average molecular weight of about 500 or less; a bisphenol F type epoxy resin; a phenol novolak type epoxy resin having an average molecular weight of about 570 or less; an alicyclic epoxy resin such as 1,2-epoxyethyl-3,4-epoxycyclohexane, 3,4-epoxycyclohexylcarboxylic acid-3,4-epoxycyclohexylmethyl and bis(3,4-epoxy-6-methylcyclohexylmethyl) adipate; a glycidyl ester epoxy resin such as diglycidyl hexahydrophthalate, diglycidyl 3-methyl-hexahydrophthalate and diglycldyl hexahydroterephthalate; a glycidylamine type epoxy resin such as diglycidyl aniline, diglycidy toluidine, triglycidyl-p-ammophenol, tetraglycidyl-m-xylylenediamine and tetraglycidyl bis(amino-methyl) cyclohexane; and a hydantoin type epoxy resin such as 1,3-diglycidyl-5-methyl-5-ethylhydantoin.

The curable epoxy resin (2) is a mixture of liquid curable epoxy resin and solid curable epoxy resin at ordinary temperature, wherein the liquid curable epoxy resin has been described in above paragraph. The solid curable epoxy resin such as a bisphenol F type epoxy resin, a novolak type epoxy resin, an alicyclic epoxy resin, a glycidyl ester type epoxy resin, a glycidylamine type epoxy resin, a triazine type epoxy resin and a hydantoin type epoxy resin, can be used in this present invention after being diluted with a diluent. Herein, any diluent, which can dissolve or disperse the epoxy resin and maintain its fluidity, can be used in the present invention.

Component (b) is represented by formula (I) or (II):

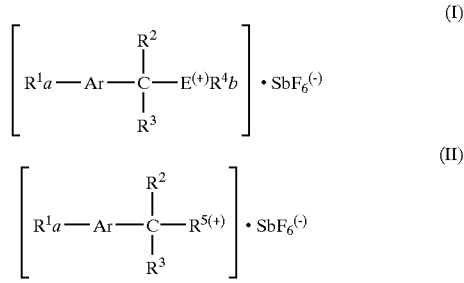

wherein E, Ar, $R^1$, $R^2$, $R^3$, $R^4$, $R^5$, a and b have the same meanings as defined above. It needs to be emphasized that the component (b) of formula (I) is an onium hexafluoroantimonate having an aromatic ring Ar bonded to a sulfur, nitrogen or phosphorous atom through —$(R_2R_3)$—. The aromatic ring Ar is a benzene ring, a naphthalene ring, an anthracene ring or a pyrene ring. A benzene ring is preferred since it can be synthesized more easily.

The aromatic ring Ar is unsubstituted or substituted by one or two $R^1$(s). $R^1$ group is selected from the group consisting of a straight or branched alkyl group such as methyl, ethyl, propyl, butyl, pentyl, octyl, decyl, dodecyl and tetradecyl; a cycloalkyl group such as cyclohexyl; a aryl group such as phenyl and naphthyl; alkaryl group such as tolyl and xylyl; an aralkyl group such as benzyl and 2-phenyl-ethyl; an alkenyl group such as vinyl, allyl and butenyl; a monovalent substituted hydrocarbon group such as chloromethyl; a hydroxyl group; a alkoxyl group such as methoxy, ethoxy, propoxy and t-butoxy; a nitro group; a cyano group; and a halogen atom, such as fluorine, chlorine, bromine and iodine. When a phosphonium salt and a pyridinium salt having relatively low activity are used, it is preferred that $R^1$ is an electron-withdrawing group or a halogen atom, since a high curing rate can be thus obtained. The introduced position of $R^1$ group is optional. However, when the Ar is a benzene ring, the $R^1$ position is preferably 2-position and/or 4-position since the compound can be synthesized easily. When $R^1$ is a bulky group, the position is particularly preferably 4-position since there is no lowering of activity caused by steric hindrance.

$R^2$ and $R^3$ groups are independently a hydrogen atom or a methyl group and preferably hydrogen atoms since the compound can be synthesized easily. When catalytic activity must be increased, it is preferred that at least one of $R^2$ and $R^3$ is a methyl group.

The $R^4$ group is selected from the group consisting of a straight or branched alkyl group such as methyl, ethyl, propyl, butyl, pentyl, octyl, decyl, dodecyl and tetradecyl; a cycloalkyl group such as cyclohexyl; an aryl group such as phenyl and naphthyl; an alkaryl group such as tolyl and xylyl; an aralkyl group such as benzyl and 2-phenyl-ethyl; an alkenyl group such as vinyl, allyl and butenyl; a monovalent substituted hydrocarbon group such as hydroxyphenyl, methoxyphenyl, ethoxyphenyl, cyanophenyl, chlorophenyl, acetoxyphenyl, propanoylphenyl, methoxvcarbonylphenyl and ethoxycarbonylphenyl.

The $R^5$ is a substituted or unsubstituted pyridinium group such as pyridinium, 2- or 4- methylpyridiniumn, 2,4-dimethylpyridinium, 2- or 4- cyanopyridinium, 2- or 4- methoxycarbonylpyridinium and 2- or 4- ethoxycarbonylpyridinium. It is preferred that $R^5$ has a nucleophilic group such as a cyano group at 2-position or 4- position.

The component (b) is a sulfonium salt, much as methyl (4-methoxybenzyl) (1-naphthylmethyl) sulfonium hexafluoroantimonate, methyl (4-hydroxyphenyl) benzyl sulfonium hexafluoroanzimonate, dimethylbenzyl sulfonium hexafluoroantimonate, dimethyl(4-methylbenzyl) sulfonium hexafluoroantimonate, dimethyl(4-methoxybenzyl) sulfonium hexafluoroantimonate, dimethyl(4-ethoylbenzyl) sulfonium hexafluoroantimonate, dimethyl(4-t-butoxybenzyl) sulfonium hexafluoroantimonate, dimethyl (4-nitrobenzyl) sulfonium hexafluoroantimonate, dimethyl (4-cyanobenzyl) sulfonium hexafluoroantimonate, dimethyl (4-chlorobenzyl) sulfonium hexafluoroantimonate, methylphenylbenzyl sulfonium hexafluoroantimonate, (4-hydroxyphenyl)benzyl sulfonium hexafluoroantimonate, dimethyl(1-naphthylmethyl) sulfonium hexafluoroantimonate, methyl (4-hydroxyl) (1-naphthyrlmethyl) sulfonium hexafluoroantimonate, dimethyl($\alpha$-methylbenzyl) sulfonium hexafluoroantimonate, etc.; an ammonium salt such as dimethylbenzyl(4-methoxybenxyl)ammonium hexafluoroantimonate, trimethylbenzylammonium hexafluoroantimonate, dimethylphenylbenzyl ammonium hexafluoroantimonate, dimethylphenyl(4-nitrobenzyl) ammonium hexafluoroantimonate, (4-cyanobenzyl) ammonium hexafluoroantimonate, (4-chlorobenzyl) ammonium hexafluoroantimonate, etc.; a phosphonium, salt such as triphenylbenzyl phosphonium hexafluoroantimonate, triphenyl(4-nitrobenzyl) phosphonium hexafluoroantimonate, etc.; and a pyridinium salt such as (4-methylbenzyl)-4-cyanopyridimum hexafluoroantimonate, (4-t-butylbenzyl)-4-cyanopyridinium hexafluoroantimonate, (4-methoxybenzyl)-4-cyanopyridinium hexafluoroantimonate, (4-chlorobenzyl)-4-cyanopyridinium hexafluoroantimonate, (α-methylbenzyl)-4-cyanopyridinium hexafluoroantimonate, benzyl-2-cyanopyridinium hexafluoroantimonate, (α-methylbenzyl)-2-cyanopyridinium hexafluoroantimonate, 4-methoxycarbonylpyridinium hexafluoroantimonate, etc.

The component (c) is a nitrile rubber containing carboxyl groups, which is a copolymeric rubber of an acrylonitrile and a butadiene and carboxylated at the molecular chain terminal. The carboxyl group of the carboxyl-containing nitrile rubber is in the range from 2 to 8% by weight. For example, the component (c) of the present invention is a carboxyl terminated butadiene acrylonitrile.

The component (d) of the present invention is an inorganic filler to make shrinkage small during the curing process, comprising a pulverized silica, spherical silica, fumy silica and precipitated silica; and powders of alumina, titania, zirconia, antimony oxide, aluminum hydroxide, calcium carbonate, glass beads, boron nitride, aluminum carbide, aluminum nitride, silicon carbide, silicon nitride, silicon nitrocarbide, titanium carbide, titanium nitride, etc.

The mixed ratio of the component (c) to component (a) is in the range from 1/5 to 10/1. If the ratio above-mentioned is greater than 10/1, the heat-resistant property of the adhesive composition will be decreased; however, if the ratio is smaller than 1/5, the adhesion strength of the adhesive composition will also be decreased. Therefore, the preferred ratio of the component (c) to component (a) of the present invention is in the range from 1/2 to 2/1. In addition, the mixed ratio of the component (b) to component (a) is in the range from 0.05% to 10% by weight. If the ratio of the component (b) to component (a) is smaller than 0.05% by weight, the curing rate of the adhesive composition will be decreased; however, if it is greater than 10% by weight, the storage stability of the adhesive composition will be decreased and the poor physical property is obtained after the adhesive composition is cured. Therefore, the preferred ratio of the component (b) to component (a) of the present invention is in the range from 0.8% to 3% by weight.

There is no curing agent contained in the adhesive composition of the present invention, such as a novolak type epoxy resin, amine or anhydride compounds. Therefore, the disadvantages caused by the curing agent, such as uniformity, toxicity and moisture absorption, is avoided. Moreover, the present invention can further comprise a flame retardant, silane compounds or titanium coupling agent, pigment, dye, etc.

The components used in the following examples and comparative examples are as follows:

| Code | Commercial name | Chemical name |
| --- | --- | --- |
| A-1 | Bisphenol A Epoxy (Epon828) | bisphenol A-epichlorohydrin type liqud epoxy resin having a molecular weight of 380; |
| A-2 | Brominated Epoxy (Epon5045) | brominated bisphenol A-epichlorohydrin type liqud epoxy resin |
| A-3 | | 3,4-epoxycyclohexanecarboxylic acid-3,4-epoxycyclohexyl |
| B-1 | | dimethyl benzyl(4-methoxybenzyl) ammonium hexafluoroantimonate |
| B-2 | | methyl(4-methoxylbenzyl)(1-naphthylmethyl) sulfonium hexafluoroantimonate |
| B-3 | | methyl(4-hydroxybenzyl)benzyl sulfonium hexafluoroantimonate |
| C | CTBN | carboxyl terminated butadiene acrylonitrile/butadiene rubber |
| D | Al(OH)$_3$ | alumium hydroxide |
| | DICY | dicyandiamide |
| | 2MI | 2-methylimidazole |

First, the components (a), (c) and (d) are mixed and a solvent, such as methyl ethyl ketone, is added into the above mixture. Then, the mixture is pulverized in a pulverizer and a solution with formula (I) is formed. The component (b) is mixed with methyl ethyl ketone and then a solution with formula (II) is formed. The solutions with formula (I) and formula (I) are mixed and pulverized by a pulverizer and then an adhesive solution with formula (III) is formed.

The viscosity test of the adhesive solution is carried out in a condition of Brookfied (LVT type). The period, for which the viscosity increases to twice the original one when the adhesive solution is standed at room temperature, is called a pot life. Moreover, the glass transition temperature of the adhesive solution is measured with Du Pont TMA 2940.

EXAMPLE 1

Step 1: preparing a solution with formula (I)

| | |
| --- | --- |
| A-1 | 50 g |
| A-2 | 50 g |
| C | 100 g |
| D | 20 g |
| methyl ethyl ketone(MEK) | 210 g | methyl ethyl ketone (MEK) 210 g

After the above components were mixed and pulverized in a pulverizer for 4 hours, the solution with formula (I) was obtained.

Step 2: preparing a solution with formula (II) (accelerator)

| | |
| --- | --- |
| B-1 | 2 g |
| methyl ethyl ketone (MEK) | 12 g |

Step 3: the solution with formula (I) and the solution with formula (II) were mixed in a ratio of 1:1 and pulverized by a pulverizer for one hour and then an adhesive solution with 50% by weight was formed.

EXAMPLE 2

The steps for preparing the adhesive solution were the same as those of Example 1; however, the accelerator of the solution with formula (II) was changed into 2 g of methyl (4-methoxylbenzyl)(1-naphthylmethyl) sulfonium hexafluoroantimonate (B-2).

EXAMPLE 3

The steps for preparing the adhesive solution were the same as those of Example 1; however, the accelerator of the solution with formula (II) was changed into 2 g of methyl (4-hydroxybenzyl)benzyl sulfonium hexafluoroantimonate (B-3).

EXAMPLE 4

The steps for preparing the adhesive solution were the same as those of Example 1; however, the amount of the component A-1 in the solution with formula (I) was 45 g and 5 g of component A-3 was added.

COMPARATIVE EXAMPLE 1

The steps for preparing the adhesive solution were the same as those of Example 1; however, the accelerator of the solution with formula (II) was 8 g of DICY and 1 g of 2MI.

COMPARATIVE EXAMPLE 2

The steps for preparing the adhesive solution were the same as those of Comparative Example 1; however, the accelerator of solution with formula (H) was 8 g of DICY and 1 g of $C_{11}Z$-2AZINE.

COMPARATIVE EXAMPLE 3

The steps for preparing the adhesive solution were the same as those of Comparative Example 1; however, the accelerator of solution with formula (II) was 8 g of DICY and 3 g of $C_{11}Z$-2AZINE.

EXAMPLE 5

Take the adhesive solution prepared in Example 1 as an example. The adhesive solution was applied on a 25 μm polyamide film and then laminated with the smooth surface of the copper foil at 170° C., 20kg/cm₂ for 10 min. The overflow of the adhesive was 50 to 75 μm and the thickness of the adhesive was 30 μm after being laminated.

The viscosity was measured by a Brookfied(LVT type) at 25° C. And the glass transition temperature was measured by the Du Pont TMA 2940 at nitrogen gas with a 20° C./min increasing rate.

The results were shown as follows:

|  | Pot Life (day) | Tg (° C.) | Adhesive strength (kg/cm) | MD (parallel coating) | TD (perpendicular coating) |
| --- | --- | --- | --- | --- | --- |
|  |  |  |  | Deflection frequency |  |
| Example 1 | 50 | 140 | 0.85 | 8163 | 10655 |
| Example 2 | 90 | 150 | 0.91 | 12608 | 11333 |
| Example 3 | 180 | 160 | 0.89 | 8455 | 9215 |
| Example 4 | 60 | 170 | 0.87 | 10664 | 9906 |
| Comparative example 1 | 10 | 140 | 0.75 | 11196 | 13077 |
| Comparative example 2 | 20 | 88 | 0.83 | 8455 | 9215 |
| Comparative example 3 | 10 | 130 | 0.90 | 11338 | 11132 |

The results in the above table show that the adhesive compositions of the present invention have higher glass transition temperature and longer storage period than the commercial adhesives.

The methods and features of this invention have been sufficiently described in the above examples and descriptions. It should be understood that any modifications or changes without departing from the spirit of the invention are intended to be covered in the protection scopes of the invention.

What is claimed is:

1. An adhesive composition being applied to a flexible printed circuit board, the adhesive composition comprising:

(a) an epoxy resin containing at least two epoxy groups, wherein the epoxy resin is selected from the group consisting of biephenol A epoxy resin, biphenol F epoxy resin, phenol novolak epoxy resin, alicyclic epoxy resin, glycidyl ester epoxy resin and hydantoin epoxy resin;

(b) an accelerator having a structure of one of the following general formulas:

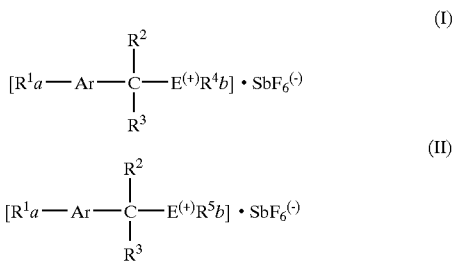

wherein, E represents sulfur, nitrogen or phosphorus; Ar represents and aromatic ring; $R^1$ is the same or different in formula (I) and formula (II) and represents a substituted or unsubstituted monovalent hydrocarbon group, a hydroxyl group, an alkoxy group, a nitro group, a cyano group, or a halogen atom; $R^2$ and $R^3$ each represents a hydrogen atom and a methyl group; $R^4$ is the same or different in formula (I) and formula (II) and represents a substituted or unsubstituted monovalent hydrocarbon group; $R^5$ represents a substituted or unsubstituted pyridinium group; a represents an integer of 0 to 2; and b represents 2 to 3;

(c) a nitrile rubber having carboxyl groups; and (d) an inorganic filler, wherein there is no curing agent contained in the adhesive composite.

2. The adhesive composition of claim 1, wherein b of the accelerator represents 2 when E is sulfur, or b represents 3 when E is nitrogen or phosphorous.

3. The adhesive composition of claim 1, further comprising a flame retardant.

4. The adhesive composition of claim 1, wherein the weight ratio of the accelerator to the epoxy resin is between 0.05:1 and 0.1:1, the weight ratio of the nitrile rubber to the epoxy resin is between 1:2 and 2:1.

5. The adhesive composition of claim 1, wherein the weight ratio of the accelerator to the epoxy resin is between 0.008:1 and 0.03:1, the weight ratio of the nitrite rubber to the epoxy resin is between 1:2 and 2:1 and the weight ratio of the inorganic filler to the epoxy resin is between 1:2 and 2:1.

6. The adhesive composition of claim 1, wherein the nitrite rubber is a carboxyl terminated butadiene acryonitrile.

7. The adhesive composition of claim 1, wherein the inorganic filler is aluminum hydroxide.

* * * * *